United States Patent [19]

Plaettner

[11] Patent Number: 5,238,879
[45] Date of Patent: Aug. 24, 1993

[54] METHOD FOR THE PRODUCTION OF POLYCRYSTALLINE LAYERS HAVING GRANULAR CRYSTALLINE STRUCTURE FOR THIN-FILM SEMICONDUCTOR COMPONENTS SUCH AS SOLAR CELLS

[75] Inventor: Rolf Plaettner, Riemerling, Fed. Rep. of Germany

[73] Assignee: Siemens Aktiengesellschaft, Munich, Fed. Rep. of Germany

[21] Appl. No.: 758,502

[22] Filed: Sep. 6, 1991

Related U.S. Application Data

[63] Continuation of Ser. No. 323,866, Mar. 15, 1989, abandoned.

[30] Foreign Application Priority Data

Mar. 24, 1988 [DE] Fed. Rep. of Germany ....... 3810023

[51] Int. Cl.$^5$ .................. H01L 31/02; H01L 21/321; H01L 21/322; H01L 21/324
[52] U.S. Cl. ..................................... 437/233; 437/234; 437/83; 136/258; 156/620.7; 156/620.72; 148/DIG. 122; 148/DIG. 152; 148/DIG. 154
[58] Field of Search .......... 437/233, 234, 83; 156/620.7, 620.72; 136/256, 258 PC; 148/DIG. 122, DIG. 152, DIG. 154

[56] References Cited

U.S. PATENT DOCUMENTS

| | | | |
|---|---|---|---|
| 3,585,088 | 6/1971 | Schwuttke et al. | 437/173 |
| 3,620,833 | 11/1971 | Gleim et al. | 437/83 |
| 3,900,943 | 8/1975 | Sirtl et al. | 437/84 |
| 3,930,067 | 12/1975 | Gorrissen | 437/233 |
| 4,087,571 | 5/1978 | Kamins et al. | 437/233 |
| 4,147,584 | 4/1979 | Garrison et al. | 156/612 |
| 4,187,126 | 2/1980 | Rodd et al. | 437/173 |
| 4,197,141 | 4/1980 | Bozler et al. | 136/258 PC |
| 4,270,960 | 6/1981 | Bollen et al. | 437/233 |
| 4,371,421 | 2/1983 | Fan et al. | 148/DIG. 2 |
| 4,379,020 | 4/1983 | Glaeser et al. | 437/233 |
| 4,434,318 | 2/1984 | Gibbons | 136/258 PC |
| 4,448,632 | 5/1984 | Akasaka | 437/233 |
| 4,620,058 | 10/1986 | Winterling et al. | 136/258 PC |
| 4,657,603 | 4/1987 | Kruehler et al. | 437/83 |
| 4,677,250 | 6/1987 | Barnett et al. | 136/258 PC |
| 4,706,376 | 11/1987 | Yamazaki et al. | 437/101 |
| 4,742,020 | 5/1988 | Roy | 437/233 |
| 4,784,723 | 11/1988 | Sakurai | 437/83 |
| 4,814,292 | 3/1989 | Sasaki et al. | 437/83 |
| 4,871,517 | 10/1989 | Falckenberg et al. | 136/258 PC |
| 4,902,642 | 2/1990 | Mao et al. | 437/62 |

FOREIGN PATENT DOCUMENTS

| | | | |
|---|---|---|---|
| 2743141 | 3/1978 | Fed. Rep. of Germany . | |
| 0085815 | 5/1986 | Japan | 437/233 |
| 0115325 | 5/1988 | Japan | 437/83 |
| 0236310 | 10/1988 | Japan | 437/83 |
| 0214139 | 8/1989 | Japan | 437/83 |
| 0248511 | 10/1989 | Japan | 437/233 |
| 0028315 | 1/1990 | Japan | 437/233 |

OTHER PUBLICATIONS

Reis et al., "Recrystallized Silicon Thin Film Structures for Solar Cells", Conference Record, 20th IEEE Photovoltaic Specialists Conf., Las Vegas, Nev., Sep. 1988, pp. 1405–1408.

Chu et al., "Polycrystalline Silicon on Coated Steel Substrates", J. Electrochem. Soc., vol. 122, No. 12, Dec. 1975, pp. 1681–1685.

Sze, *VLSI Technology*, McGraw-Hill Book Co., New York, N.Y., 1983 pp. 83–84.

Von Hartmut Frey et al, "Dunnschichtsolarzellen, eine Chance, sonnenenergie wirtschaftlich in elektrische Energie umzuwandeln", VDI-Z-121 (1979), No. 8 Apr., pp. 389–393.

*Primary Examiner*—Mary Wilczewski
*Attorney, Agent, or Firm*—Hill, Steadman & Simpson

[57] ABSTRACT

A method for producing polycrystalline layers having granular crystalline structure is provided. Pursuant to the method, a thin intermediate layer of amorphous is deposited before the deposition of the polycrystalline layer in order to avoid crystal structure influence proceeding from the substrate. The layer is then recrystallized applying a pattern of crystallization points or the amorphous layer. A detrimental effect of the fine-crystalline structure of the substrate is prevented by the amorphous intermediate layer. Pursuant to the present invention, the thin-film technology can also be utilized for polycrystalline silicon layers, this being especially desirable in the manufacture of solar cells.

7 Claims, 1 Drawing Sheet

METHOD FOR THE PRODUCTION OF POLYCRYSTALLINE LAYERS HAVING GRANULAR CRYSTALLINE STRUCTURE FOR THIN-FILM SEMICONDUCTOR COMPONENTS SUCH AS SOLAR CELLS

This is a continuation of application Ser. No. 323,866, filed Mar. 15, 1989, now abandoned.

BACKGROUND OF THE INVENTION

The invention is directed to a method for producing polycrystalline layers having a granular crystalline structure as used for thin-film semiconductor components, particularly for silicon crystal cells. The polycrystalline layer is deposited from a gaseous, or vapor, phase onto insulating or electrically conductive substrates, or onto substrates having a coating of electrically conductive material, and through a subsequent heat treatment the layer is recrystallized.

Economic considerations have created a need to reduce the costs of solar cells and therefore, a need for new and more economic methods for the production of thin semiconductor layers. Previous methods for producing thin semiconductor layers, such as, for example, the epitaxial growth method for producing single-crystalline layers on suitable substrates, are too expensive to be used for creating solar cells and are therefore not utilized; even though they create the highest quality thin semiconductor layers. Examples of methods for manufacturing solar cells are set forth in, for example, the periodical VDI-Z-121 (1979), No. 8, April, pages 389 through 393.

When the layer are to be utilized in applications wherein defects in the crystalline, active semiconductor layer can be tolerated, with reference to the efficiency of the device, such as, for example, in solar cells, lower cost substrates are desireable as carriers for the thin layers produced thereon. To this end, for example, sheet metal can be used for this purpose. The layers can be deposited on these substrates from the vapor phase. Methods that proceed at lower temperatures are preferable. This, on the one hand, accommodates the selection of the material for the substrates, and also lowers the cost of the method by lowering the expenditure of energy.

The layers that are created, however, have the disadvantage that they contain an excessively great number of grain boundaries. The grain diameters typically are below 1 μm. It is possible, however, to recrystallize these layers in order to improve the quality. To this end, for example, heated graphite rods can be passed over the layer, near the surface of the layer. The layer can also be superficially recrystallized with a suitable lamp and optics. High surface speeds can be achieved. But, the influence of the crystalline substrate creates some problems; the crystal structure thereof can have an unfavorable influence on the process of recrystallization, or the recrystallization can be prevented since the microcrystallites of the substrate always influence the thin films situated thereon.

SUMMARY OF THE INVENTION

The present invention provides a method that suppresses the influence of the crystal structure of the substrate during the recrystallization that ensues after the deposition of a polycrystalline layer on the substrate.

To this end, a method is provided for the production of polycrystalline layers having granular crystalline structure as used for thin-film semiconductor components, particularly for silicon solar cells by deposition of the polycrystalline layer from a gaseous or vapor phase onto insulating or electrically conductive substrates, or onto substrates provided with a coating of electrically conductive material, the layer being recrystallized by a subsequent heat treatment. The method includes the step of precipitating an amorphous intermediate layer, of the same or similar material as the polycrystalline layer on the substrate before the application of the polycrystalline layer, so that the polycrystalline layer can be recrystallized independently of the substrate. The amorphous intermediate layer being significantly thinner than the polycrystalline layer.

In an embodiment of the method, the amorphous intermediate layer is provided with a grid of crystallization centers.

In an embodiment of the method, the grid of crystallization centers is produced optically or thermically, for example, by punctiform irradiation of the surface of the amorphous layer.

In an embodiment of the method, the grid of crystallization centers is produced electrically, for example by spark discharge, or by heating of the surface of the amorphous layer, through the use of spatially varying resistance heating that is moved over a surface integrated in a ledge.

In an embodiment of the method, the grid of crystallization centers is produced mechanically, for example by moving a drum having needles across the surface of the amorphous layer.

In an embodiment, the grid of crystallization centers is formed by etching in the amorphous layer a hole pattern.

In an embodiment, a grid of crystallization centers having a spacing of approximately 1 to about 5 mm is utilized.

In an embodiment of the method, a polycrystalline layer composed of silicon is provided, and the intermediate layer is produced from amorphous silicon or, given the presence of a metal substrate, is formed of amorphous silicon dioxide.

In an embodiment of the method, the amorphous intermediate layer is produced by deposition from the vapor phase, preferably through glow discharge plasma.

In an embodiment of the method, the polycrystalline layer is recrystallized by passing a heated graphite rod over the surface of the polycrystalline layer near the surface thereof.

In an embodiment of the method, a tempering process in a hydrogen atmosphere is performed following the recrystallization process.

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The present invention provides a method for producing polycrystalline layers wherein an amorphous intermediate layer, of the same or similar material as the polycrystalline layer is precipitated on the substrate, before the application of the polycrystalline layer and the latter is recrystallized independently of the substrate. The amorphous intermediate layer is significantly thinner than the polycrystalline layer.

In an embodiment of the present invention, the amorphous intermediate layer can be provided with a grid of crystallization centers. Due to the crystallization points, that are impressed into the amorphous layer, during a subsequent recrystallization process, only a few nuclei in the created layer grow and, thus, a granular crystalline layer structure arises. Crystallite areas of approximately 1 to about 100 mm$^2$ can be achieved.

Figure 1:
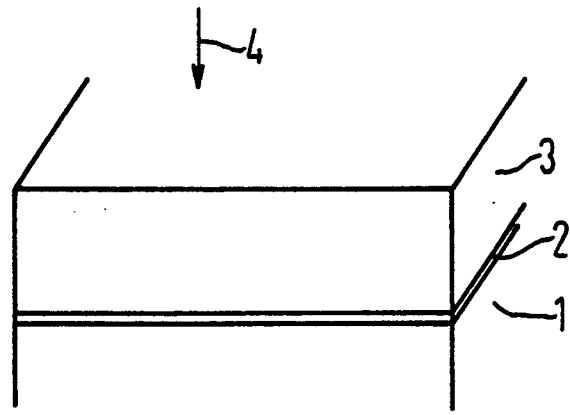
FIG. 1 illustrates a perspective cross-sectional view of a layer sequence for the production of granular crystalline layers.

Referring now to FIG. 1, onto a substrate having a fine-crystalline structure, for example, a thin stainless steel band 1, an amorphous silicon dioxide layer 2 of approximately 1 to about 5 nm thick is applied by deposition from hydrosilicon (silane, SiH$_4$) in an oxidizing atmosphere, in a glow discharge plasma. A method for producing amorphous silicon layers through a glow discharge plasma is disclosed, for example, in German published application 27 43 141.

Onto the amorphous intermediate layer 2, a polycrystalline silicon layer 3 having a layer thickness of, for example, 20 μm is applied by deposition from the vapor phase through thermic decomposition of hydrosilicon which can be also plasma enhanced. Through the application of recrystallization energy from, for example, the top (indicated arrow 4) —for example with heated graphite rods—, the polycrystalline silicon layer 3 is converted into a granular crystalline condition, without being influenced by the fine-crystalline structure of the substrate 1.

The method of the present invention is especially useful for manufacturing granular crystalline silicon layers for solar cells. By way of example, the intermediate layer 2 can be produced from amorphous silicon or, if the substrate is metal, the intermediate layer can be produced from amorphous silicon dioxide, for the electrical insulation thereof. The remaining grain boundaries can be further reduced by hydrogen passivation after the recrystallization 4 of the polycrystalline silicon layer 3.

Even for applications wherein one wants to create thick-film solar cells, the advantages of thin-film technology also are usable for the polycrystalline silicon in view of the method of the present invention. For example, the layers can be constructed by structuring as strip-shaped cells and can be interconnected in series.

Moreover, in addition to being suitable for solar cells, the method is also suitable for other applications. These applications include those where material layers having large, granular crystalline crystallite surfaces are desirable.

Figure 2:
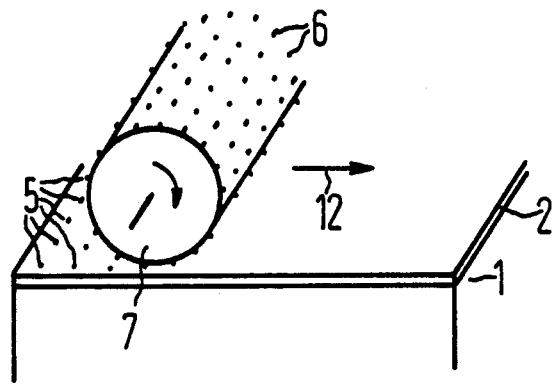
FIG. 2 illustrates a perspective view of an embodiment of the method of the present invention for mechanically impressing a grid of crystallization points into the amorphous intermediate layer.

Referring now to FIG. 2, an embodiment of the method of the present invention is illustrated. In the embodiment of the method illustrated, it is possible to impress a grid of crystallization points 5 externally on the amorphous intermediate layer 2. Preferably, the grid has a spacing of approximately 1 to about 5 mm.

In the embodiment of the method illustrated in FIG. 2, the grid of crystallization points 5 is produced mechanically. In the embodiment illustrated, the grid 5 is produced by rolling a drum 7 having needles 6, located at appropriate intervals, over the surface of the amorphous layer 2, located on the substrate 1, to produce the crystallization points 5.

Figure 3:
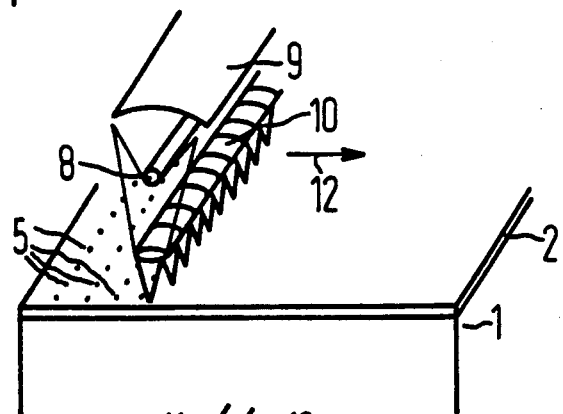
FIG. 3 illustrates a perspective view of another embodiment of the method of the present invention for optically impressing a grid of crystallization points into the amorphous intermediate layer.

FIG. 3 illustrates another embodiment of the method of the present invention. In the embodiment illustrated in FIG. 3, the grid of the crystallization points 5 is produced optically. For example, a light-optical, strip-shaped system composed of a rod-shaped light source 8, reflector 9, and a lens system 10 can be moved across the surface 1, 2 in the direction of the arrow 12 to produce the crystallization points 5.

Figure 4:
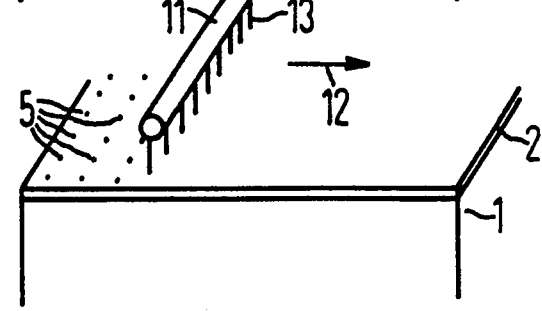
FIG. 4 illustrates a perspective view of another, embodiment of the method of the present invention for electrically impressing a grid of crystallization points into the amorphous intermediate layer.

FIG. 4 illustrates another embodiment of the method of the present invention. In the embodiment of the method illustrated in FIG. 4, the grid of crystallization points 5 is produced electrically. Specifically, in the embodiment illustrated, the grid 5 is produced by an electrode 11 having tips 13 that are conducted across the surface 1, 2 in a direction indicated by the arrow 12.

Furthermore, it is also possible to produce the grid of crystallization points 5 by etching a hole pattern into the amorphous intermediate layer 2.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for the generation of polycrystalline layers with a coarsely crystalline structure for thin-film semiconductor components comprising the steps of:
   depositing a thin amorphous intermediate layer on a substrate;
   electrically generating a grid of crystallization centers in the amorphous intermediate layer by means of an electrical conductor having tips, said electrical conductor being moved across the surface of the amorphous intermediate layer;
   depositing a polycrystalline layer from a vapor phase on the amorphous intermediate layer in such a manner that the amorphous intermediate layer is considerably thinner than the resultant polycrystalline layer; and
   implementing a heat treatment for a recrystallization of the polycrystalline layer dependent on the grid of the crystallization centers.

2. The method of claim 1 wherein a grid having a spacing of from approximately 1 to about 5 mm is created.

3. The method of claim 1 wherein a polycrystalline layer composed of silicon is provided and the intermediate layer is produced from amorphous silicon.

4. The method of claim 1 wherein the amorphous intermediate layer is produced by deposition from the vapor phase.

5. The method of claim 4 wherein the amorphous intermediate layer is produced by a glow discharge plasma.

6. The method of claim 1 wherein a tempering process in a hydrogen atmosphere is carried out following the recrystallization process.

7. The method of claim 1 wherein the amorphous intermediate layer is constructed from the same material as the polycrystalline layer.

* * * * *